United States Patent
In et al.

(10) Patent No.: US 8,212,569 B1
(45) Date of Patent: Jul. 3, 2012

(54) COUPLED BI-STABLE CIRCUIT FOR ULTRA-SENSITIVE ELECTRIC FIELD SENSING UTILIZING DIFFERENTIAL TRANSISTOR PAIRS

(75) Inventors: Visarath In, Chula Vista, CA (US); Norman Liu, San Diego, CA (US); Patrick Longhini, San Diego, CA (US); Yong (Andy) Kho, Chula Vista, CA (US); Joseph D. Neff, San Diego, CA (US); Adi R. Bulsara, San Diego, CA (US); Antonio Palacios, San Diego, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 361 days.

(21) Appl. No.: 12/749,338

(22) Filed: Mar. 29, 2010

Related U.S. Application Data

(63) Continuation-in-part of application No. 12/175,262, filed on Jul. 17, 2008, now Pat. No. 8,049,486.

(51) Int. Cl.
*G01R 29/12* (2006.01)
*G01R 31/02* (2006.01)
(52) U.S. Cl. .......................... 324/457; 324/72
(58) Field of Classification Search ................ 324/457, 324/72
See application file for complete search history.

(56) References Cited

U.S. PATENT DOCUMENTS

| | | | |
|---|---|---|---|
| 3,760,268 A | 9/1973 | Ruhnke | |
| 6,008,642 A | 12/1999 | Bulsara et al. | |
| 6,020,782 A | 2/2000 | Albert et al. | |
| 6,222,423 B1 | 4/2001 | Sudjian | |
| 6,714,469 B2 | 3/2004 | Rickes et al. | |
| 6,785,629 B2 | 8/2004 | Rickes et al. | |
| 7,154,768 B2 | 12/2006 | Chen et al. | |
| 7,196,590 B1 | 3/2007 | In et al. | |
| 7,339,381 B2 * | 3/2008 | Van Berkel | 324/452 |
| 7,420,366 B1 | 9/2008 | In et al. | |
| 7,528,606 B1 | 5/2009 | In et al. | |
| 2009/0195245 A1 | 8/2009 | In et al. | |

OTHER PUBLICATIONS

Visarath In, Patrick Longhini, Norman Liu, Andy Kho, Joseph D. Neff, Antonio Palacios, and Adi R. Bulsara; A bistable microelectronic circuit for sensing extremely low electric field; Journal of Applied Physics 107, 014506, published online Jan. 6, 2010; American Institute of Physics.

Unpublished U.S. Appl. No. 12/732,023; submitted to the USPTO on Mar. 25, 2010, titled "Coupled Bi-Stable Microcircuit System for Ultra-Sensitive Electrical and Magnetic Field Sensing.".

(Continued)

*Primary Examiner* — Amy He

(74) *Attorney, Agent, or Firm* — Kyle Eppele; J. Eric Anderson

(57) ABSTRACT

An ambient electric field detector comprising: a collection mechanism disposed to generate a current signal in response to the ambient electric field; an input current mirror operatively coupled to the collection mechanism and disposed to amplify and duplicate the current signal to generate a duplicate signal; and an odd number (i) of at least three nonlinear, over-damped, bi-stable elements coupled uni-directionally in a ring such that the ring of elements oscillates, wherein at least one of the elements has a different initial state than the other elements and each element is disposed to receive the duplicate signal.

20 Claims, 7 Drawing Sheets

OTHER PUBLICATIONS

Non-Published U.S. Appl. No. 12/175,262, filed Jul. 17, 2008, titled "Coupled Electric Field Sensors for DC Target Electric Field Detection".

Non-Published U.S. Appl. No. 12/561,990, filed Sep. 17, 2009 titled "Frequency Down-Conversion System Using Arrays of Coupled Non-Linear Elements".

Non-Published U.S. Appl. No. 12/391,506, filed Feb. 24, 2009, titled "Wideband Non-Linear Circuits for Implementation in Frequency Channel Separation".

A. Bulsara, V. In, A. Kho, P. Longhini, A. Palacios, W-J. Rappel, J. Acebron, S. Baglio, and B. Ando. Emergent oscillations in unidirectionally coupled overdamped bistable systems. Phys. Rev. E 70, 036103-1-12 (2004).

V. In, A. Bulsara, A. Palacios, P. Longhini, A. Kho and J. Neff. Coupling-induced oscillations in overdamped bistable systems. Physical Review E 68, Rapid Communication (2003) 045102-1.

A. Palacios, J. Aven, V. In, P. Longhini, A. Kho, J. Neff, and A. Bulsara. Coupled-core fluxgate magnetometer: Novel configuration scheme and the effects of a noise-contaminated external signal. Physics Letters A 367,25-34 (2007).

V. In, A. Kho, A. Bulsara, J. Neff, S. Baglio, V. Sacco, A. Palacios, and P. Longhini. Coupling nonlinear sensors for enhanced sensitivity: A prototype using the three coupled-core fluxgate magnetometer. Proceedings of the 4th IEEE Conference on Sensors. Irvine, CA, Mar. 2006 57-60.

A. Palacios, R. Carretero-Gonzalez, P. Longhini, N. Renz, V. In, A. Kho, J. Neff, B. Meadows. and A. Bulsara. Multifrequency synthesis using two coupled nonlinear oscillator arrays. Physical Review E 72, 026211 (2005).

Visarath In, Andy Kho, Joseph D. Neff, Antonio Palacios, Patrick Longhini, and Brian K. Meadows. Experimental Observation of Multifrequency Patterns in Arrays of Coupled Nonlinear Oscillators, Physical Review Letters vol. 91, No. 24. (2003).

Visarath In, Adi Bulsara, Andy Kho, Antonio Palacios, Patrick Longhini, Juan Acebron, Salvatore Aglio and Bruno Ando. Self-Induced Oscillations in Electronically-Coupled Fluxgate Magnetometers; Experimental Chaos: 8th Experimental Chaos Conference, AIP Conference Proceedings, vol. 742, pp. 57-62 (2004).

A. Bulsara, J.F. Lindner, V. In, A. Kho, S. Baglio, V. Sacco, B. Ando, P. Longhini, A. Palacios, and W. J. Rappel Coupling-Induced cooperative behavior in dynamic ferromagnetic cores in the presence of a noise floor, Physics Letters A 353 4-10 (2006).

V. In, A. Bulsara, A. Kho, A. Palacios, S. Baglio, B. Ando, and V. Sacco. Dynamic cooperative behavior in a coupled-core fluxgate magnetometer IEEE, ICAS 2006, 0-7-7803-9390-2/06, 5171-5174 (2006).

Visarath In, Andy Kho, Adi R. Bulsara, Joseph D. Neff, Salvatore Baglio, Vincenzo Sacco. Antonio Palacios, and Patrick Longhini, Coupling Nonlinear Sensors for Enhanced Sensitivity: A Prototype Using the 3 Coupled-Core Fluxgate Magnetometer; IEEE 0-7803-9056-3/05: 57-60 (2005).

Visarath In, Andy Kho, Adi R. Bulsara, Antonio Palacios, Salvatore Baglio, B. Ando, Patrick Longhini, Joseph D, Neff, Brian K. Meadows. Self-Induced Oscillations in Coupled Fluxgate Magnetometer: A Novel Approach to OPERATiNG the Magnetic Sensors: IEEE, ICAS 2004, 0-7303-8251-X/04, 736-739 (2004).

Non-Published U.S. Appl. No. 12/125,397, filed May 22, 2008, titled "Coupled Nonlinear Elements for Frequency Down-Conversion Systems and Methods".

Non-Published U.S. Appl. No. 11/755,601, filed May 30, 2007, titled "Wideband Nonlinear "Channelizer" for Rapid Processing of Static and Time-Varying Signals".

Viisarath In et al.; Complex Dynamics in Unidirectionally Coupled Overdamped Bistable Systems Subject to a Time-Periodic External Signal; Physical Review E 72, 045104(R), 2005.

Visarath In et al.; Complex Behavior in Driven Unidirectionally Coupled Overdamped Duffing Elements; Physical Review E, 73, 066121, 2006.

Patrick Longhini, Antonio Palacios, Visarath In, Joseph D. Neff, Andy Kho, and Adi Bulsara; Exploiting dynamical symmetry in coupled nonlinear elements for efficient frequency down-conversion; Phys. Rev. E 76, 026201 (2007)—Published Aug. 1, 2007.

* cited by examiner

COUPLED BI-STABLE CIRCUIT FOR ULTRA-SENSITIVE ELECTRIC FIELD SENSING UTILIZING DIFFERENTIAL TRANSISTOR PAIRS

CROSS-REFERENCE TO RELATED APPLICATION

This application is a continuation-in-part of U.S. application Ser. No. 12/175,262, "Coupled Electric Field Sensors for DC Target Electric Field Detection," filed 17 Jul. 2008 now U.S. Pat. No. 8,049,486 (Navy Case #97455), hereby incorporated by reference herein in its entirety for its teachings, and referred to hereafter as "the parent application."

FEDERALLY-SPONSORED RESEARCH AND DEVELOPMENT

This invention is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email T2@spawar.navy.mil. Reference Navy Case Number 99576.

BACKGROUND OF THE INVENTION

Certain sensor systems involve nonlinear sensors that utilize a known time-periodic bias signal to excite the sensors to oscillate. A target signal is detected by noting its effect on the sensor's oscillation level-crossing statistics. These sensing techniques are accurately represented via the dynamics of over-damped bi-stable systems; as such, their solutions (in the absence of any driving signals or noise) are those that decay rapidly to one of the stable steady states of the detector system. Yet, for nonlinear sensors to effectively serve as detectors of target signals, the sensors need to be operated as a device that switches between its stable attractors, thereby enabling one to quantify the target signal via its effect on the sensor switching dynamics.

SUMMARY

Disclosed herein is an ambient electric field detector comprising: a collection mechanism disposed to generate a current signal in response to the ambient electric field; an input current mirror operatively coupled to the collection mechanism and disposed to amplify and duplicate the current signal to generate a duplicate signal; and an odd number (i) of at least three nonlinear, over-damped, bi-stable elements coupled uni-directionally in a ring such that the ring of elements oscillates, wherein at least one of the elements has a different initial state than the other elements and each element is disposed to receive the duplicate signal.

In another embodiment, the electric field detector may comprise a system for detecting weak electric fields comprising: a collection mechanism disposed to generate a current signal in response to the ambient electric field; an input current mirror operatively coupled to the collection mechanism and disposed to amplify and duplicate the current signal to generate a duplicate signal; an odd number of at least three over-damped, bi-stable elements coupled uni-directionally in a ring such that the ring of elements oscillates. At least one of the elements has a different initial state than the other elements and each element is disposed to receive the duplicate signal. Each element comprises the following components: a) first and second differential pairs of N type-P type-N type (NPN) transistors wherein the second differential pair is cross-coupled; b) an electrical load operatively coupled to the first and second differential pairs; c) first and second nodes $V_{out+}$ and $V_{out-}$, respectively, operatively coupled between the load and the two differential pairs, wherein the first and second nodes are disposed to be equal in magnitude and out of phase by 180 degrees, and wherein the second node $V_{out-}$ of each element is disposed to receive the duplicate signal; and d) first and second current mirrors operatively coupled to the first and second differential pairs respectively.

In addition, the electric field detector 10 may be practiced as a method for detecting weak electric fields, comprising the steps of: a) causing a uni-directionally coupled ring of an odd number of at least three over-damped, bi-stable elements to oscillate by adjusting system parameters of the ring; b) receiving an electrical signal on a collection plate; c) transforming the electrical signal into a current signal; d) amplifying and duplicating the current signal with an input current mirror to generate a duplicate signal; e) directing the duplicate signal into each element of the ring; and f) monitoring an output from each element.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

Figure 1:
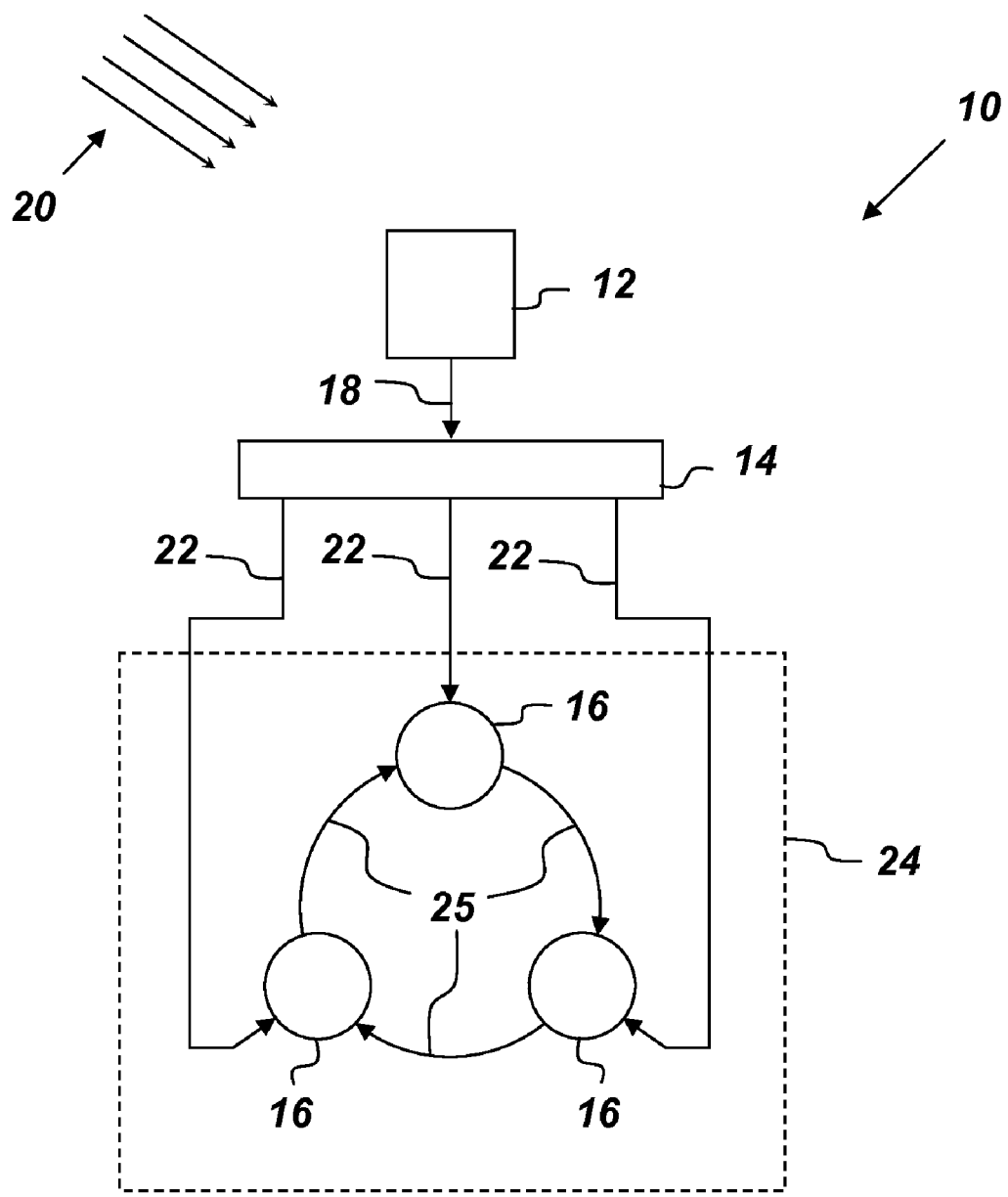
FIG. 1 is a schematic diagram of an embodiment of an electric field detector.

FIG. 1 is a drawing of an electric field detector 10 that comprises a collection mechanism 12, an input current mirror 14, and an odd number (n) of at least three nonlinear, over-damped, bi-stable elements 16. The collection mechanism 12 is disposed to generate a current signal 18 in response to an ambient electric field 20. The collection mechanism 12 may be any device disposed to generate a current in the presence of the electric field 20. A suitable example of the collection mechanism 12 is the collection plate disclosed in greater detail in the parent application. The input current mirror 14 is operatively coupled to the collection mechanism 12 and disposed to amplify and duplicate the current signal 18 to generate a duplicate signal 22. The bi-stable elements 16 are coupled uni-directionally in a ring 24 such that the element ring 24 oscillates. The uni-directional coupling of the elements 16 is depicted in FIG. 1 by signal path lines 25. In one embodiment, at least one of the elements 16 has a different initial state than the other elements 16 and each element 16 is disposed to receive the duplicate signal 22. In this design, the states are represented by the output voltage on 16. By virtue that each of the elements 16 will start with a random initial state, the ring 24 should automatically oscillate.

The electric field detector 10 may be fabricated on a microchip. The operating principle of the electric field detector 10 is based on the generation of internal oscillations in the element ring 24, a coupled nonlinear dynamic system that does not normally (i.e., absent the coupling) oscillate. The elements 16 in the element ring 24 are bi-stable in nature (by design). The frequency and other dynamical characteristics of the emergent oscillations depend on the system and target signal characteristics. Hence, the electric field detector 10 can be used to detect and/or quantify very weak dc and time dependent target electric field signals depending on how it is configured for a specific application. For example, the electric field detector 10 can be used to detect the presence of a person based on the static charge on that person's clothing. The electric field detector 10 may also be manufactured on a microchip.

The electric field detector 10 may be employed to detect both dc and ac signals. For a dc signal, the element ring 24 behaves with consistent oscillations where amplitudes are constant, but the frequency changes, and the duty cycle is skewed in proportion to the magnitude of the dc field. The residence time difference (RTD) readout strategy similar to other sensor systems such as the fluxgate magnetometer disclosed in U.S. patent application Ser. No. 11/858,966, "Coupled Fluxgate Magnetometers for DC and Time-Dependent (AC) Target Magnetic Field Detection," which is incorporated by reference herein, may be used to discern the signal. For low frequency (ac) signal, a power spectral density (PSD) method, which is well known in the discipline, may be used to discern the signal amplitude and frequency.

Coupling an odd number of over-damped, bi-stable elements 16 in a ring 24 uni-directionally can lead to oscillation, given that at least one of the elements 16 has a different initial state than the others and the coupling strength exceeds a certain threshold value, which is known to system users. Here, we are using this concept for constructing an electric field detector 10 for detecting low amplitude and low frequency electric fields.

The following are the equations (or dynamics) for an element ring 24 consisting of odd-numbered, uni-directionally coupled bi-stable elements 16 (N=3):

$$\tau \dot{x}_1 = -gx_1 - I_c \tan h(c_c * x_3) + I_s \tan h(c_s * x_1) + \epsilon$$
$$\tau \dot{x}_2 = -gx_2 - I_c \tan h(c_c * x_1) + I_s \tan h(c_s * x_2) + \epsilon$$
$$\tau \dot{x}_3 = -gx_3 - I_c \tan h(c_c * x_2) + I_s \tan h(c_s * x_3) + \epsilon \quad (1)$$

Where $x_i$ for i=1, 2, ..., N is a state variable usually in the unit of volts, $\tau$, g, $I_c$, $I_s$, $c_c$ and $c_s$ are element ring 24 parameters, and $\epsilon$ is an external dc target signal. The element ring 24 will oscillate with $\epsilon$=0 if the coupling strength, which is a function of the element ring 24 parameters, exceeds a threshold value. The oscillation of each element 16 in the element ring 24 is out of phase by 360/N degrees, where N is the number or elements 16 in ring 24. When $\epsilon \neq 0$, the oscillation characteristics of the element ring 24 change as a function of $\epsilon$. Also, the sensitivity of the element ring 24 is enhanced if the element ring 24 is tuned close to the onset of oscillation (or bifurcation point).

Figure 2:
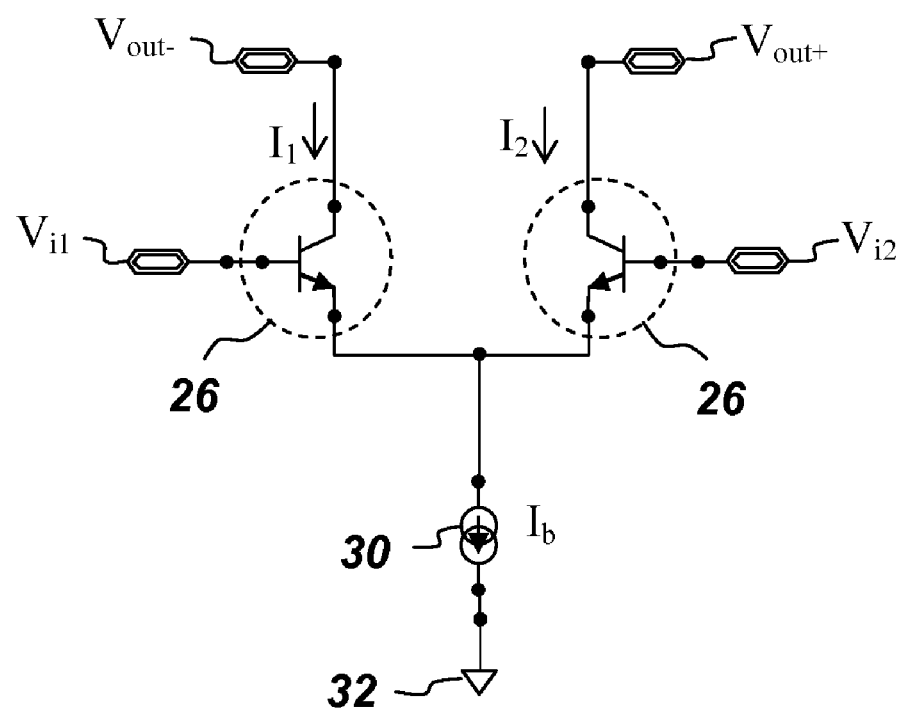
FIG. 2 is a schematic diagram of an embodiment of a typical differential pair.

In one embodiment, the electrical field detector 10 utilizes differential pairs of N type-P type-N type (NPN) transistors 26 in each element 16. FIG. 2 shows a wiring diagram of a typical differential pair 28 comprising two NPN transistors 26, a current source 30, and a ground connection 32. One of the NPN transistors 26 is coupled to input $V_{i1}$. The other NPN transistor 26 is coupled to input $V_{i2}$. The current and voltage relationship of the differential pair 28 can be modeled as follows:

$$I_1 - I_2 = I_b \tan h(c * (V_{i1} - V_{i2})) \quad (2)$$

where $I_b$ is the bias (or tail) current of the differential pair 28 and c is a device parameter. The current $I_1$ is the current measured at output node $V_{out+}$, and the current $I_2$ is the current measured at output node $V_{out-}$.

Figure 3:
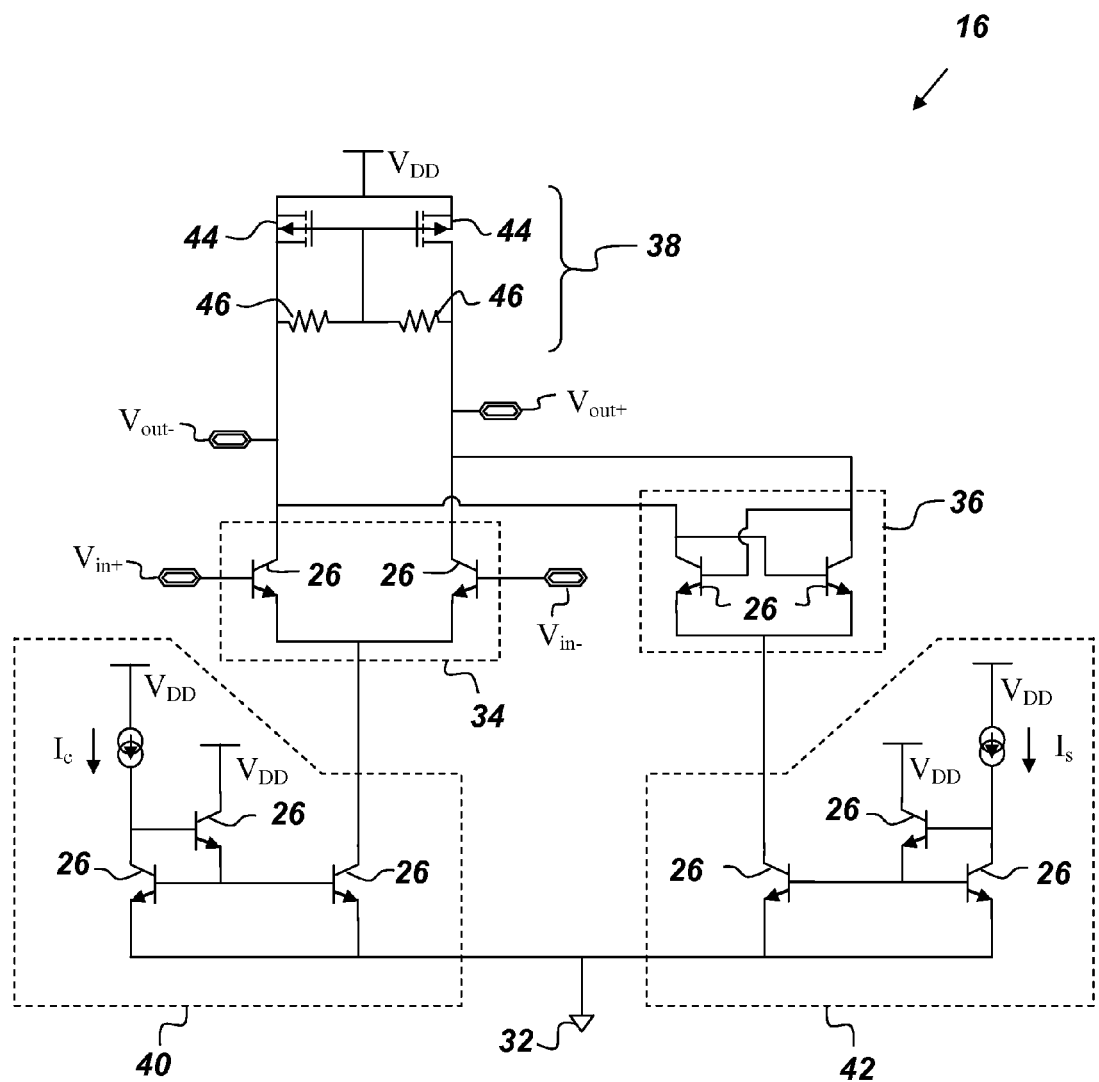
FIG. 3 is a schematic diagram of an embodiment of a single element of an electric field detector.

FIG. 3 shows an embodiment of the bi-stable element 16 that comprises first and second differential pairs 34 and 36 of NPN transistors 26, and an electrical load 38. As opposed to the typical differential pair 28 shown in FIG. 2, which is coupled to the current source 30, the first and second differential pairs 34 and 36 in FIG. 3 are coupled to first and second current mirrors 40 and 42, respectively. As shown in FIG. 3, the second differential pair 36 is cross-coupled. The electrical load 38 is operatively coupled to the first and second differential pairs 34 and 36. The output nodes $V_{out+}$ and $V_{out-}$ are operatively coupled between the load 38 and the two differential pairs 34 and 36. The output nodes $V_{out+}$ and $V_{out-}$ are disposed to be equal in magnitude and out of phase by 180 degrees. The input node $V_{in-}$ of each element 16 is disposed to receive the duplicate signal 22. The first and second current mirrors 40 and 42 are operatively coupled to the first and second differential pairs 34 and 36, respectively.

In the embodiment of element 16 shown in FIG. 3, the electrical load 38 comprises two P-type metal-oxide-semiconductor (PMOS) transistors 44 and two resistors 46 operatively coupled between the output nodes $V_{out+}$ and $V_{out-}$. The two PMOS transistors 44 are used as the load of the two differential pairs 34 and 36, and the two resistors 46 are used for both the system dynamics as well as common-mode feedback. Since the circuit is fully-differential (i.e. the output, $V_{out+}$ and $V_{out-}$, are substantially equal in magnitude but are out of phase by approximately 180 degrees), the common-mode voltages at $V_{out+}$ and $V_{out-}$ needs to be "tracked" in case of any mismatches in the manufacturing of the device. Thus, the pair of resistors 46 is used to "track" the voltages at the two nodes $V_{out+}$ and $V_{out-}$. The resistors 46 may be variable such that substantially similar voltages may be maintained at the two nodes $V_{out+}$ and $V_{out-}$ of each element 16.

Figure 4:
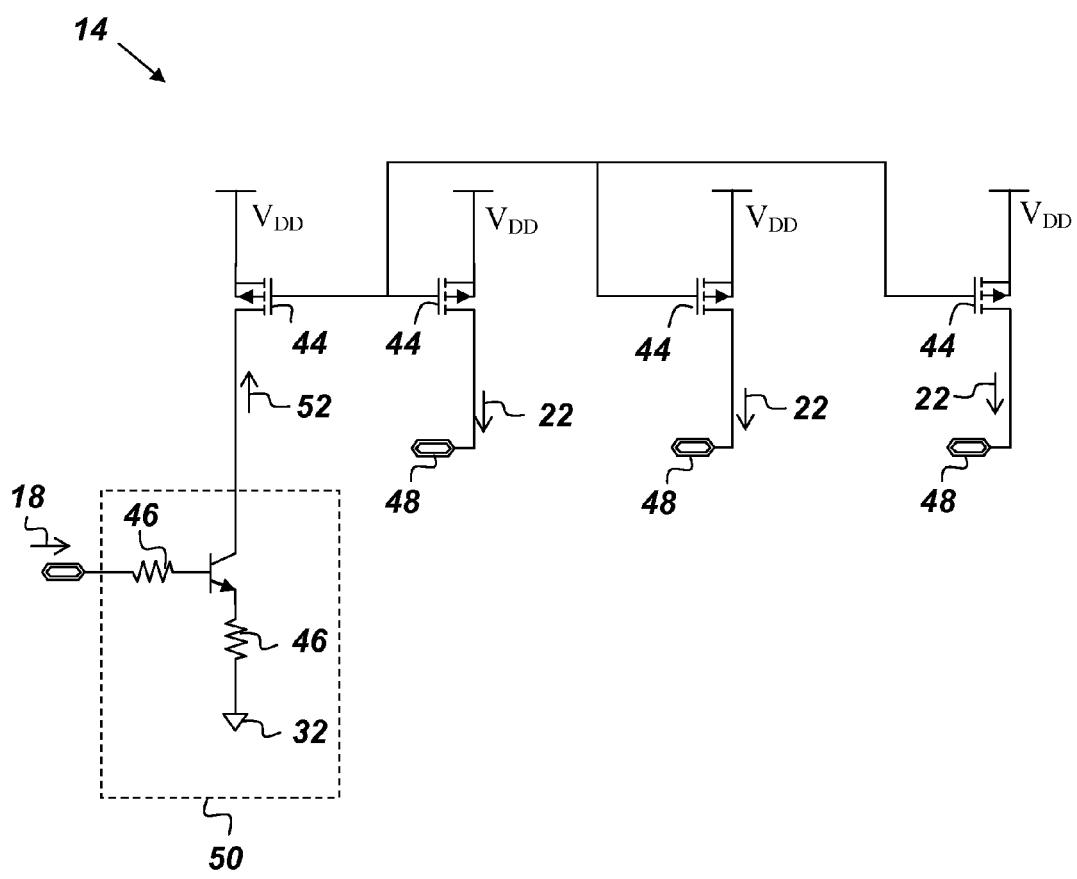
FIG. 4 is a schematic diagram of an embodiment of an input current mirror.

FIG. 4 is a schematic diagram of an embodiment of the input current mirror 14 having three output nodes 48. Although only three output nodes are shown in FIG. 4, it is to be understood that the input current mirror 14 may have any desired number of output nodes 48. Before the current signal 18 reaches the input current mirror 14, the current signal 18 may be amplified using a NPN transistor 26. The NPN transistor 26 and the resistors 46, shown in box 50, are not considered to be part of the input current mirror 14. For example, in one embodiment, the input current mirror 14 may be manufactured on a microchip and the components in box 50 would be off-chip components. An amplified signal 50 is then inputted into the current mirror 14, where it is transformed into the duplicate signal 22. The duplicate signal 22 is directed by output node 52. By doing so, $I_{out} = \beta * I_{sig}$, where $\beta$ is the current gain of the NPN transistor 26 shown in box 50, $I_{out}$ is the duplicate signal 22, and $I_{sig}$ is the current signal 18. Each output node 48 is connected to node $V_{in-}$ of each element 16.

Using nodal analysis, the current equations at the output nodes $V_{out+}$ and $V_{out-}$ of the $n^{th}$ element 16 are as follows:

$$C_L * \dot{V}_{out+} = I_p + \frac{V_{gp} - V_{out+}}{R} - \frac{I_c}{2} \tanh(c_c * (V_{in-} - V_{in+})) - \frac{I_s}{2} \tanh(c_s * (V_{out-} - V_{out+})) \quad (3)$$

-continued $$C_L * \dot{V}_{out-} = I_p + \frac{V_{gp} - V_{out-}}{R} - \frac{I_c}{2}\tanh(c_c * (V_{in+} - V_{in-})) - \frac{I_s}{2}\tanh(c_s * (V_{out+} - V_{out-})) + \varepsilon \quad (4)$$

where
$C_L$=the load capacitance of the load 38,
R=the resistance of the pair of resistors 46 shown in FIG. 3,
$c_c$ and $c_s$=device parameters, which are proportional to e/2kT and their values are approximately $(7\text{-}10)V^{-1}$,
$V_{gp}$=the voltage at the gate voltage of the PMOS transistors 44 shown in FIG. 3,
$I_p$, which is equal to $$\frac{\mu_p C_{ox}}{2} \frac{W_p}{L_p}(V_{dd} - V_{gp} + V_{tp})^2, =$$

the current through one of the PMOS transistors 44,
$V_{tp}$=the threshold voltage,
$\mu_p$=the mobility in the PMOS,
$C_{ox}$=oxide capacitance,
$W_p$=width of the PMOS,
$L_p$=length of the PMOS,
$V_{in+}$ and $V_{in-}$=the output $V_{out-}$ and $V_{out+}$ from the (n−1) element 16 respectively, and
$\varepsilon = \beta * I_{sig}$.
Subtracting equation 4 from equation 3, we get the following expression:

$$C_L * \dot{V}_i = -gV_i - I_c\tanh(c_c*V_{i-1}) + I_s\tanh(c_s*V_i) - \varepsilon \quad (5)$$

where $V_i = V_{out+} - V_{out-}$ is the differential output of the $i^{th}$ element and g=1/R. Note that equation 5 and equation 1 are the same with $C_L$ replacing $\tau$, and $V_i$ replacing $x_i$ as the state variable.

Figure 5:
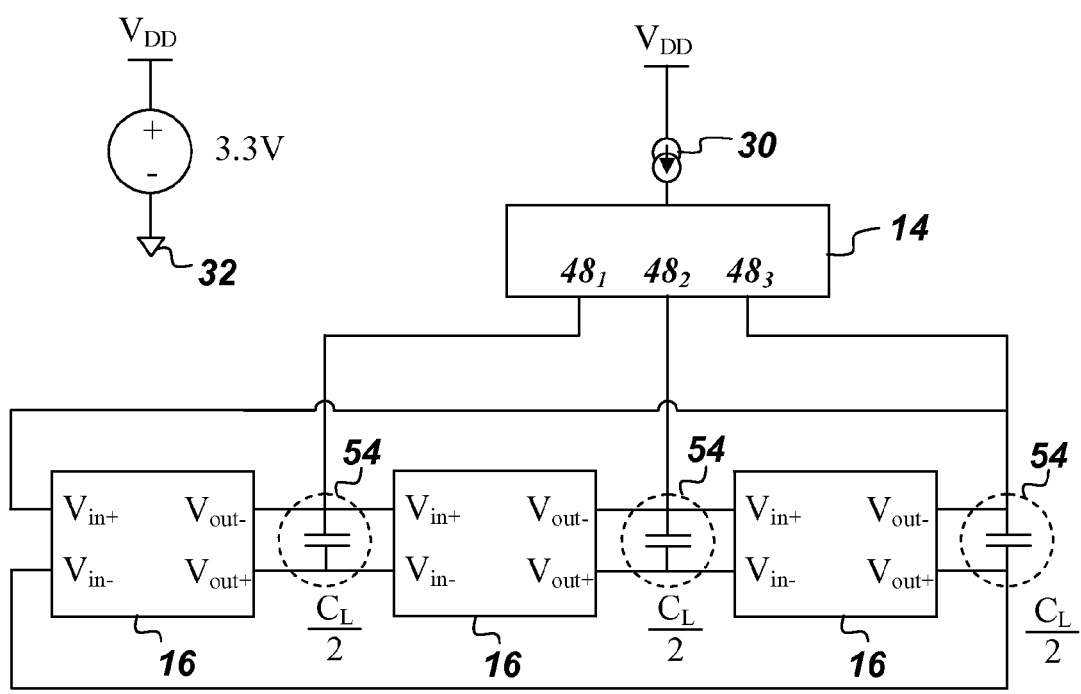
FIG. 5 is a schematic diagram of an electric field detector.

FIG. 5 shows a top-level system schematic of the electric field detector 10 having three elements 16. The load circuit in FIG. 5 consists of a load capacitor 54 with the value $C_L/2$ connecting $V_{out-}$ and $V_{out+}$ of each node. The value of $C_L$ is chosen such that it is greater than the total parasitic capacitance, $C_p$, at that node (i.e. $C_L >> 10*C_p$).

The electric field detector 10 may be used as an RTD detector as follows. First, the element ring 24 is tuned so that it oscillates prior to receiving the current signal 18. The element ring 24 is more sensitive if it is tuned close to the onset (bifurcation point or threshold) of oscillation. Therefore, the element ring 24 parameters, $I_c$ and $I_s$, need to be set so that the coupling strength, which is a function of these parameters, just exceeds the threshold value for oscillation. Without the presence of a current signal 18, the differential output, $V_i$, should be symmetric in its duty cycle. That means, during a period of the output, the time above V=0, $t_p$, is about the same as the time below V=0, $t_n$, and the residence time difference, RTD=$|t_p-t_n|$, should be very small or close to zero. As the current signal 18 increases, the differential output becomes more asymmetric in its duty cycle, which results in an increase of RTD. At the same time, the frequency of oscillation decreases.

Figure 6A:
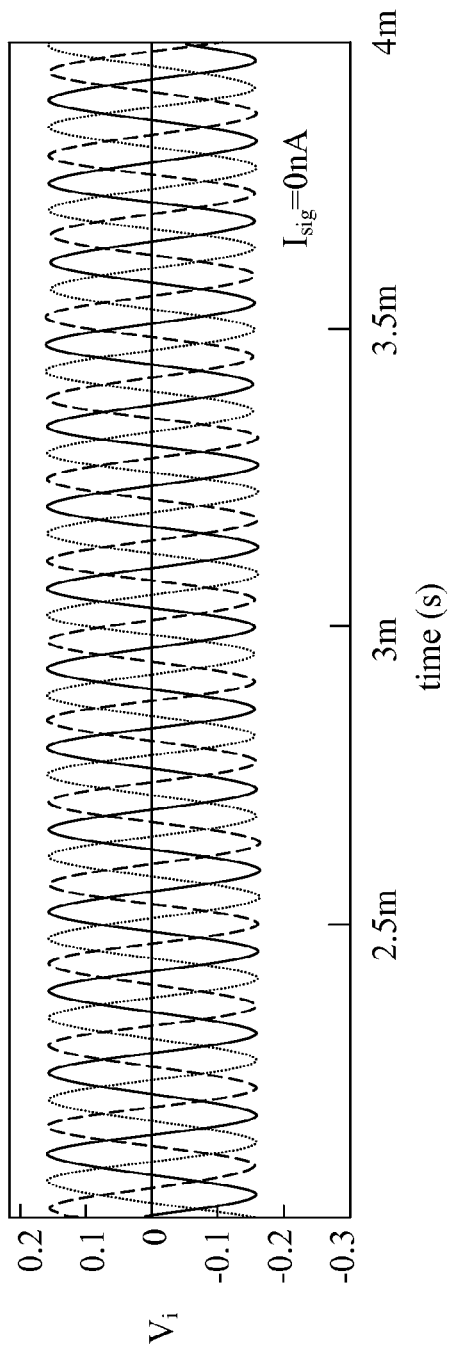
FIGS. 6a-6b are plots of output waveforms of an electric field detector with different input current values.
Figure 6B:
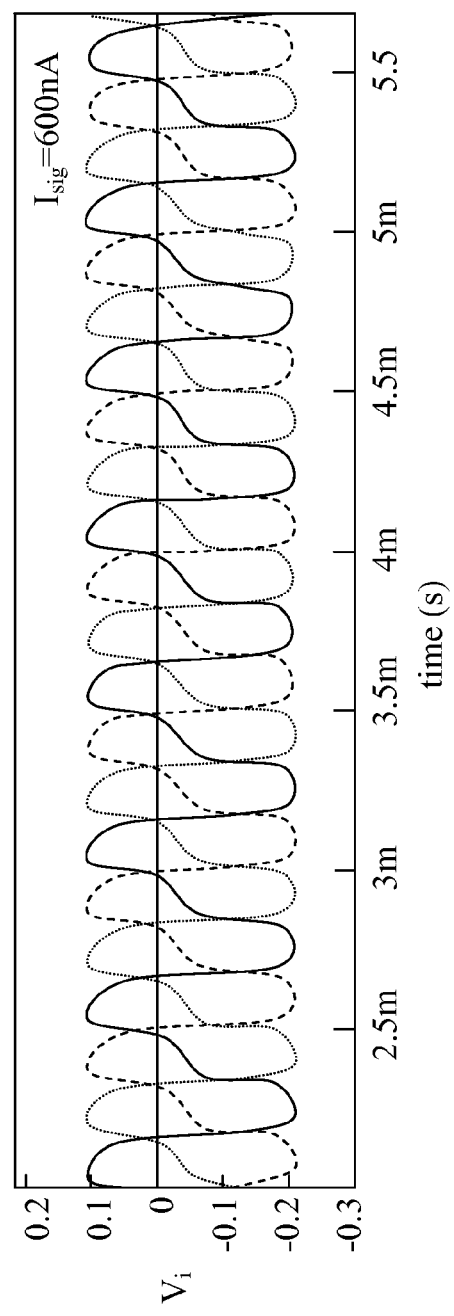
Figure 7:
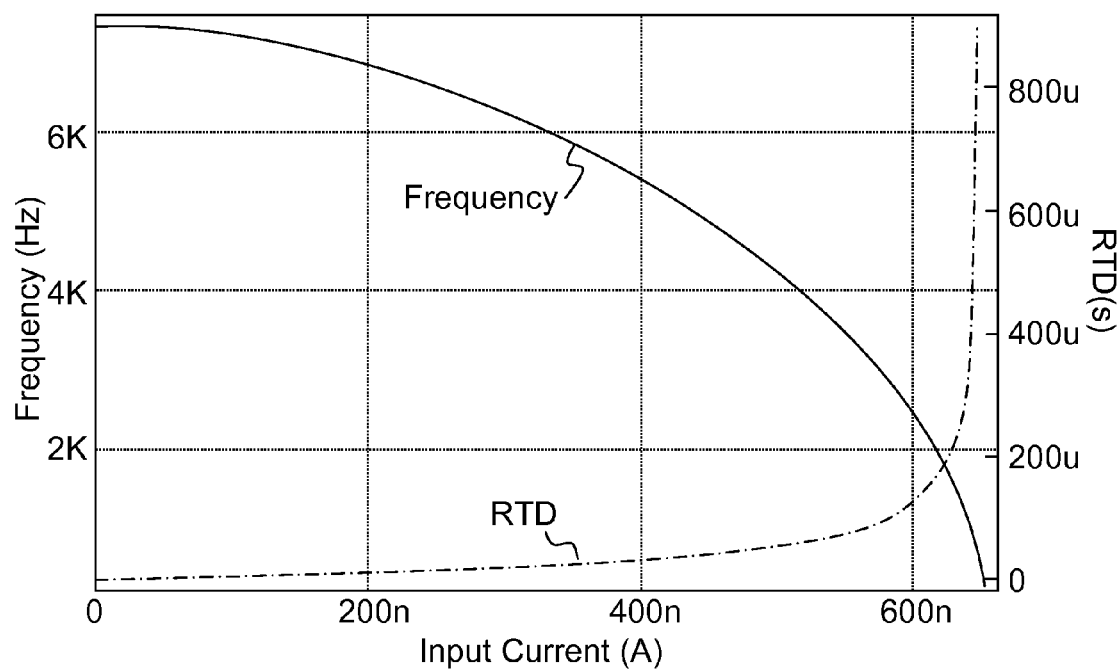
FIG. 7 is a plot of input current vs. RTD and output oscillation frequency of an electric field detector.

FIGS. 6a-6b and 7 are graphs showing the results of the circuit simulation described above. The parameters for the simulation are $I_c$=200 μA, $I_s$=150 μA, $C_L$=20 nF, R=500 Ohms and β≈150. In FIGS. 6a-6b, the waveforms of the differential output from all 3 elements 16 are plotted with different values of input dc current simulating the input current from a collection plate, $I_{sig}$. As expected, the outputs are out of phase by 120 degrees. In FIG. 7, the output oscillation frequency and RTD are plotted against input current. The frequency decreases and RTD increases as input current increases as predicted. Notice the sharp upturn of the RTD curve when the input current is large so that the three coupled elements 16 are pushed toward the bifurcation point. The slope of this curve indicates the sensitivity of the electric field detector 10 to a small amount of change in the electric field 20. By turning to nearly vertical means the slope is very high which indicates that the sensitivity of the electric field detector 10 is greatest for detecting small signals near this bifurcation point.

The electric field detector 10 may further comprise a display operatively coupled to the ring of elements 24 to display the oscillations. The electric field detector 10 may be disposed to operate in current mode which means that the signal from the collection mechanism 12 can be input directly into the element ring 24 without additional conversion to voltage via nonlinear capacitors or other media. The electric field detector 10 can be configured to sense different level of input dc and ac signals by tuning system parameters. As mentioned above, the electric field detector 10 can be designed and fabricated in a chip with the standard microchip fabrication technology.

From the above description of the electric field detector 10, it is manifest that various techniques may be used for implementing the concepts of the electric field detector 10 without departing from its scope. The described embodiments are to be considered in all respects as illustrative and not restrictive. It should also be understood that the electric field detector 10 is not limited to the particular embodiments described herein, but is capable of many embodiments without departing from the scope of the claims.

We claim:
1. An ambient electric field detector comprising:
a collection mechanism disposed to generate a current signal in response to the ambient electric field;
an input current mirror operatively coupled to the collection mechanism and disposed to amplify and duplicate the current signal to generate a duplicate signal; and
an odd number (i) of at least three nonlinear, over-damped, bi-stable elements coupled uni-directionally in a ring such that the ring of elements oscillates, wherein at least one of the elements has a different initial state than the other elements and each element is disposed to receive the duplicate signal.

2. The detector of claim 1, wherein each element comprises:
a) first and second differential pairs of N type-P type-N type (NPN) transistors wherein the second differential pair is cross-coupled;
b) an electrical load operatively coupled to the first and second differential pairs;
c) first and second nodes $V_{out+}$ and $V_{out-}$, respectively, operatively coupled between the load and the two differential pairs, wherein the first and second nodes are disposed to be equal in magnitude and out of phase by 180 degrees, and wherein the second node $V_{out-}$ of each element is disposed to receive the duplicate signal; and
d) first and second current mirrors operatively coupled to the first and second differential pairs respectively.

3. The detector of claim 2, wherein each element further comprises two resistors operatively coupled between the first and second nodes and configured to track the dynamics of the element and the common-mode voltages at the first and second nodes.

4. The detector of claim 3, wherein the load of each element comprises two positive channel metal oxide semiconductor (PMOS) transistors operatively coupled to the first and second differential transistor pairs.

5. The detector of claim 4, wherein the two resistors are variable and wherein the two resistors are adjusted such that substantially similar voltages are maintained at the first and second nodes of each element.

6. The detector of claim 5, wherein the collection mechanism is a collection plate.

7. The detector of claim 6, wherein the detector fabricated on a microchip.

8. The detector of claim 5, further comprising a display operatively coupled to the ring of elements and disposed to display the oscillations.

9. The detector of claim 5, wherein the ring of elements is tuned close to the onset of oscillation to detect small amplitude signals.

10. The detector of claim 1, wherein the detector is disposed to operate in current mode.

11. A system for detecting small changes in the environment comprising:
  a collection mechanism disposed to generate a current signal in response to a characteristic of the environment;
  an input current mirror operatively coupled to the collection mechanism and disposed to amplify and duplicate the current signal to generate a duplicate signal;
  an odd number of at least three over-damped, bi-stable elements coupled uni-directionally in a ring such that the ring of elements oscillates, wherein at least one of the elements has a different initial state than the other elements and each element is disposed to receive the duplicate signal, and wherein each element comprises:
    a) first and second differential pairs of N type-P type-N type (NPN) transistors wherein the second differential pair is cross-coupled;
    b) an electrical load operatively coupled to the first and second differential pairs;
    c) first and second nodes $V_{out+}$ and $V_{out-}$, respectively, operatively coupled between the load and the two differential pairs, wherein the first and second nodes are disposed to be equal in magnitude and out of phase by 180 degrees, and wherein the second node $V_{out-}$ of each element is disposed to receive the duplicate signal; and
    d) first and second current mirrors operatively coupled to the first and second differential pairs respectively.

12. The system of claim 11, wherein each element further comprises two resistors operatively coupled between the first and second nodes and configured to track the dynamics of the element and the common-mode voltages at the first and second nodes.

13. The system of claim 12, wherein the load of each element comprises two positive channel metal oxide semiconductor (PMOS) transistors operatively coupled to the first and second differential transistor pairs.

14. A method for detecting weak electric fields, comprising the steps of:
  a) causing a uni-directionally coupled ring of an odd number of at least three over-damped, bi-stable elements to oscillate by adjusting system parameters of the ring;
  b) receiving an electrical signal on a collection plate;
  c) transforming the electrical signal into a current signal;
  d) amplifying and duplicating the current signal with an input current mirror to generate a duplicate signal;
  e) directing the duplicate signal into each element of the ring; and
  f) monitoring an output from each element.

15. The method of claim 14, wherein the electrical signal is a low frequency alternating current (ac) signal, and wherein the method of 14 further comprises the step of discerning the amplitude and frequency of the electrical signal utilizing a power spectral density (PSD) function.

16. The method of claim 14, wherein the electrical signal is a direct current (dc) signal such that the element ring behaves with consistent oscillations where the frequency and amplitudes are constant but the duty cycle is skewed in proportion to the magnitude of the dc field.

17. The method of claim 16, further comprising the step of discerning the electrical signal by utilizing a residence time difference (RTD) readout strategy.

18. The method of claim 14, wherein each element comprises:
  1) first and second differential pairs of negative-positive-negative (NPN) transistors wherein the second differential pair is cross-coupled;
  2) an electrical load operatively coupled to the first and second differential pairs;
  3) first and second nodes $V_{out+}$ and $V_{out-}$, respectively, operatively coupled between the load and the two differential pairs, wherein the first and second nodes are disposed to be equal in magnitude and out of phase by 180 degrees, and wherein the second node $V_{out-}$ of each element is disposed to receive the duplicate signal; and
  4) first and second current mirrors operatively coupled to the first and second differential pairs respectively.

19. The method of claim 18, wherein each element further comprises two resistors operatively coupled between the first and second nodes and configured to track the dynamics of the element and the common-mode voltages at the first and second nodes.

20. The method of claim 19, wherein the load of each element comprises two positive channel metal oxide semiconductor (PMOS) transistors operatively coupled to the first and second differential transistor pairs.

* * * * *